(12) United States Patent
Kohler et al.

(10) Patent No.: US 8,207,786 B2
(45) Date of Patent: *Jun. 26, 2012

(54) INCREASING CHARGE CAPACITY OF CHARGE TRANSFER CIRCUITS WITHOUT ALTERING THEIR CHARGE TRANSFER CHARACTERISTICS

(75) Inventors: Edward Kohler, New Haven, CT (US); Michael P. Anthony, Andover, MA (US)

(73) Assignee: Kenet, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/093,462

(22) Filed: Apr. 25, 2011

(65) Prior Publication Data

US 2011/0199151 A1   Aug. 18, 2011

Related U.S. Application Data

(63) Continuation of application No. 12/330,270, filed on Dec. 8, 2008, now Pat. No. 7,932,767.

(60) Provisional application No. 61/005,772, filed on Dec. 7, 2007.

(51) Int. Cl.
*G05F 3/02* (2006.01)
(52) U.S. Cl. .................................. 327/536; 327/284
(58) Field of Classification Search .............. 327/284, 327/285, 91, 96
See application file for complete search history.

(56) References Cited

U.S. PATENT DOCUMENTS

| | | | | |
|---|---|---|---|---|
| 4,984,256 A * | 1/1991 | Imai | ................................ | 377/60 |
| 5,291,083 A * | 3/1994 | Blalock et al. | ................ | 327/284 |
| 6,356,148 B1 * | 3/2002 | Marble | ............................. | 330/9 |
| 2002/0005751 A1 * | 1/2002 | Myono | ........................ | 327/536 |
| 2007/0063760 A1 * | 3/2007 | Stopel | ........................... | 327/536 |
| 2007/0252639 A1 * | 11/2007 | Yamashita | ................... | 327/536 |
| 2008/0205581 A1 * | 8/2008 | Anthony | ........................ | 377/57 |

FOREIGN PATENT DOCUMENTS

WO   WO 2009/075812 A3   6/2009

OTHER PUBLICATIONS

Non-Final Office Action for U.S. Appl. No. 12/330,270; Date Mailed: May 25, 2010.
Notice of Allowance and Fee(s) Due for U.S. Appl. No. 12/330,270; Date Mailed: Dec. 16, 2010.
Response to Rule 312 Communication for U.S. Appl. No. 12/330,270; Date Mailed: Mar. 21, 2011.
Shin, D., et al., "A Unified Voltage Generator which Merges the Pumping Capacitor of Boosted Voltage Generator and Substrate Voltage Generator," *Journal of the Institute of Electronics Engineers of Korea*, No. 2003-40SD-11-6, pp. 45-53 (2003).

(Continued)

*Primary Examiner* — Lincoln Donovan
*Assistant Examiner* — Ryan Jager
(74) *Attorney, Agent, or Firm* — Hamilton, Brook, Smith & Reynolds, P.C.

(57) ABSTRACT

A technique for increasing the charge storage capacity of a charge storage device without changing its inherent charge transfer function. The technique may be used to implement a charge domain signal processing circuits such as Analog to Digital Converters (ADCs) used in digital radio frequency signal receivers.

15 Claims, 4 Drawing Sheets

OTHER PUBLICATIONS

Notification of Transmittal of the International Search Report and the Written Opinion of the International Searching Authority, or the Declaration, for International Application No. PCT/US2008/013479, date of mailing Jul. 7, 2009, consisting of 9 pages.

Notification Concerning Transmittal of the International Preliminary Report on Patentability, for International Application No. PCT/US2008/013479, date of mailing Jun. 17, 2010, consisting of 3 pages.

* cited by examiner

US 8,207,786 B2

INCREASING CHARGE CAPACITY OF CHARGE TRANSFER CIRCUITS WITHOUT ALTERING THEIR CHARGE TRANSFER CHARACTERISTICS

RELATED APPLICATIONS

This application is a Continuation of U.S. application Ser. No. 12/330,270, filed Dec. 8, 2008, now U.S. Pat. No. 7,932,767, which claims the benefit of U.S. Provisional Application No. 61/005,772, filed on Dec. 7, 2007. The entire teachings of the above applications are incorporated herein by reference.

BACKGROUND OF THE INVENTION

In charge-domain signal-processing circuits, signals are represented as charge packets. These charge packets are stored, transferred from one storage location to another, and otherwise processed to carry out specific signal-processing functions. Charge packets are capable of representing analog quantities, with the charge-packet size in coulombs being proportional to the signal represented. Charge-domain operations such as charge-transfer are driven by 'clock' voltages, providing discrete-time processing. Thus, charge-domain circuits provide analog, discrete-time signal-processing capability.

In certain charge-domain signal-processing circuits, the charge packets are stored on capacitors. Most charge-domain operations can be described by the well known expression, Q=CV, where Q represents the size of the charge packet, in Coulombs, C represents the capacitance on which the charge packet is stored, in Farads, and V represents the voltage of the node on which the charge packet is stored, in Volts. The process of charge transfer and storage in a charge-domain signal-processing circuit is explained with the aid of FIGS. 1 and 2. These figures omit some of the details needed to implement a complete charge domain signal processing circuit, but they suffice to permit the description below of the essential features of charge storage and transfer in charge-domain circuits (such details are described in other published patent applications by Anthony, M., such as U.S. Patent Publication No. 2007/0279507 entitled "Boosted Charge Transfer Circuit" and U.S. Patent Publication 2008/0205581 entitled "Common-mode Charge Control in a Pipelined Charge-domain Signal-Processing Circuit" hereby incorporated by reference). Charge, as represented by electrons, flows in the opposite direction from conventional current. Note that all descriptions below assume electrons as the signal-charge carriers. The corresponding quantities of charge (Q) in the equations have negative values. The identical description can be applied equally well using holes as charge carriers with reversed voltage polarities.

FIG. 1 depicts a simple charge transfer and storage circuit and FIG. 2 shows the potential charge-storage of node A shown in FIG. 1. Assume Node A has been given an initial voltage of $V_{Aic}$ (such as may be imposed by closing a pre-charge switch PRE at some time prior to time $t_0$). Its potential (voltage) is then allowed to float (such as by then opening switch PRE at time $t_0$). One terminal of capacitor $C_A$, which provides a charge-storage function, is connected to node A; the other terminal of capacitor $C_A$ is connected to a static voltage $V_1$. When a quantity of charge (Q) is transferred onto node A at time $t_1$, (such as by closing switch SW1) the voltage at Node A falls to voltage $V_{A1}$. Please note that switches SW1 and SW2 are meant to illustrate charge transfer functions at a conceptual level. Practical charge transfer circuits are typically more complex or different, and the exact design of SW1 and SW2 are not pertinent to the present invention. Equation 1 relates the transferred charge, $Q_i$, to the node voltage at A, $V_{A1}$, given the capacitance of node A, $C_A$, and its initial potential, $V_{Aic}$.

$$V_{A1}=V_{Aic}-Q_i/C_A \qquad \text{Equation 1}$$

In charge storage devices, the allowable voltage at Node A is constrained by various factors relating to the specific circuit implementation. In circuits using electrons as the charge carrier, the initial voltage, $V_{Aic}$, is usually set to the most positive voltage available $V_{A1}$ is limited by the minimum Voltage ($V_{Amin}$) at which electrons can be attracted from the transferring source and stored. This constraint sets the maximum allowable charge that can be transferred onto node A. Equation 2 relates the charge capacity of Node A, $Q_{imax1}$, to the minimum voltage allowed at Node A, $V_{Amin}$, given the capacitance of node A, $C_A$, and its initial potential $V_{Aic}$.

$$Q_{imax1}=(V_{Aic}-V_{Amin})C_A \qquad \text{Equation 2}$$

Charge transfer off of storage node A begins at time $t_2$. At time $t_2$, a switch SW2 is closed which connects node A to a voltage source SV delivering a voltage $V_o$. The quantity of charge transferred through the voltage source SV is described by Equation 3 which relates the charge transferred through the voltage source, $Q_{o1}$, to the initial charge transferred to node A, $Q_i$, given the capacitance of node A, $C_A$, its initial potential $V_{Aic}$, and the potential, $V_o$ of the voltage source SV.

$$Q_{o1}=Q_i-(V_{Aic}-V_o)C_A \qquad \text{Equation 3}$$

As stated above, in charge-domain signal-processing circuits, the signal is represented by a charge packet. In this case, the charge $Q_1$ transferred onto node A represents the signal, thus the maximum signal value allowed is $Q_{imax1}$. In all analog circuits, one figure of merit is the signal-to-noise ratio (SNR). Equation 4 describes this quantity.

$$\text{SNR}=\text{Signal/Noise}=Q_{imax1}/Q_{noise} \qquad \text{Equation 4}$$

Equation 2 describes the quantity Qimax1. In the simplified circuit of FIG. 1, the quantity Qnoise is often referred to as kTC noise and is proportional to the square root of capacitance, $C_A$. Equation 5 describes this relationship.

$$Q\text{noise}=\sqrt{(kTC_A)} \qquad \text{Equation 5}$$

Substituting Equations 5 and 2 into Equation 4 gives Equation 6.

$$\text{SNR}=(V_{Aic}-V_{Amin})\sqrt{(C_A)}/\sqrt{(kT)} \qquad \text{Equation 6}$$

From Equation 6, it is clear that SNR is proportional to the square root of $C_A$ and the voltage difference ($V_{Aic}-V_{Amin}$). Since a change in either of these quantities will result in a change in $Q_{o1}$, as expressed in Equation 3, it is not possible to increase SNR without altering the charge transfer characteristics of this simplified circuit. (Similar limitations apply to more complex circuits.) Moreover, the conventional approach of increasing $C_A$ to improve SNR can be shown to increase the area occupied by the circuit and also the power consumed. It would therefore be beneficial to improve SNR in some manner that does not create these disadvantages while also not altering the circuit's charge transfer characteristics.

SUMMARY OF THE INVENTION

In the prior art, increasing SNR has been achieved by increasing the capacitance of the charge storage nodes of the system. This method is disadvantageous for several reasons. First, the charge transfer characteristics are altered, necessitating circuit and system changes. Second, due to the square-law relation between SNR and capacitance, it takes a quadratic change in $C_A$ to produce a linear change in SNR. Finally, increasing capacitance $C_A$ results in a physically larger implementation that consumes more power.

It would be advantageous to allow the charge capacity of a node to be increased, thereby increasing its signal-to-noise ratio, and without changing its inherent charge transfer function or incurring the usual penalties associated with increasing $C_A$.

In a preferred embodiment, this is accomplished by connecting a clock signal to a charge storage device such as a capacitor. The clock signal adjusts a voltage difference across the capacitor while charge is being transferred, but then returns the voltage difference to an initial condition thereafter. The result is to increase the charge capacity without changing the amount of charge transferred.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Figure 1:
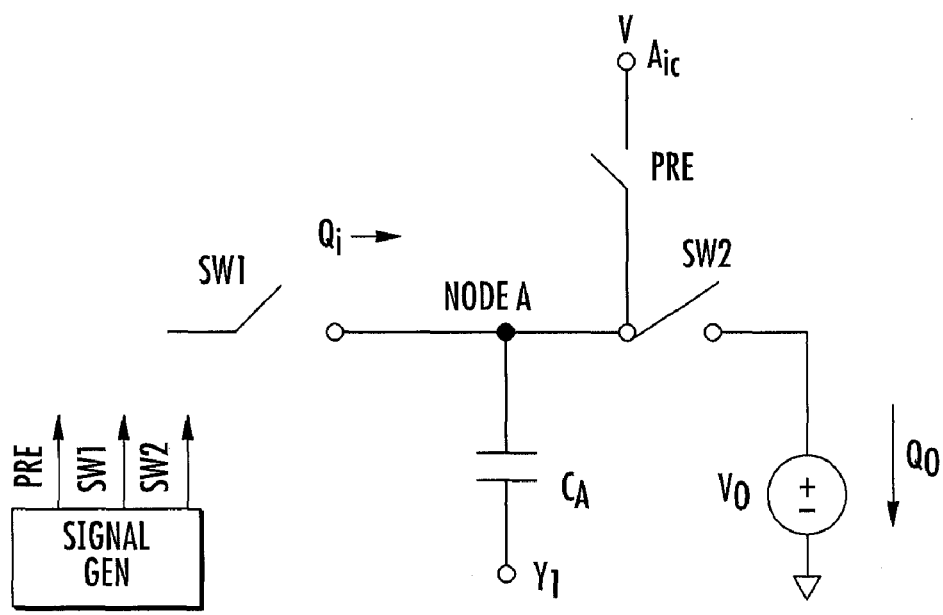
FIG. 1 is a simplified diagram of a known charge storage circuit.
Figure 3:
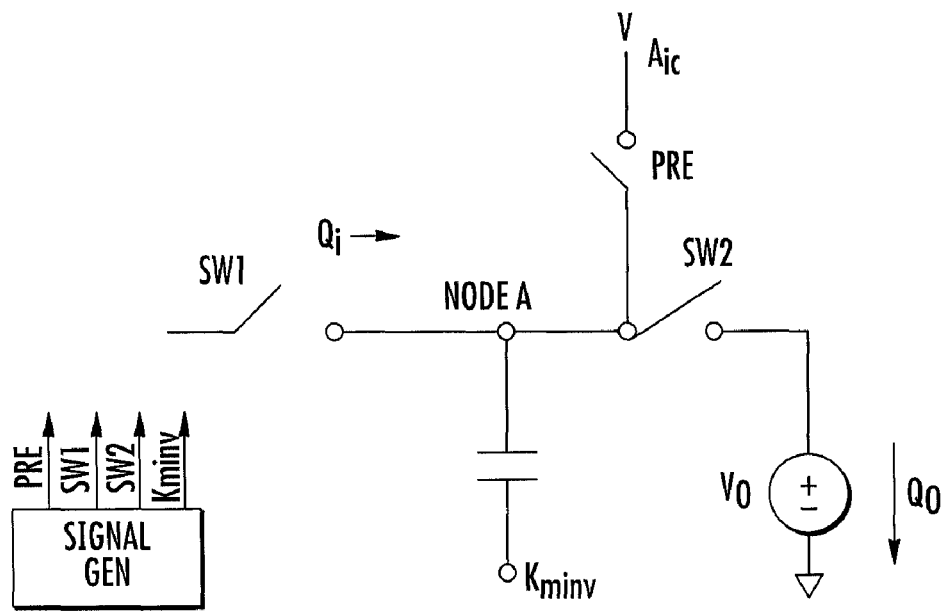
FIG. 3 is a simplified diagram of a charge storage circuit that implements the present invention.
Figure 4A:
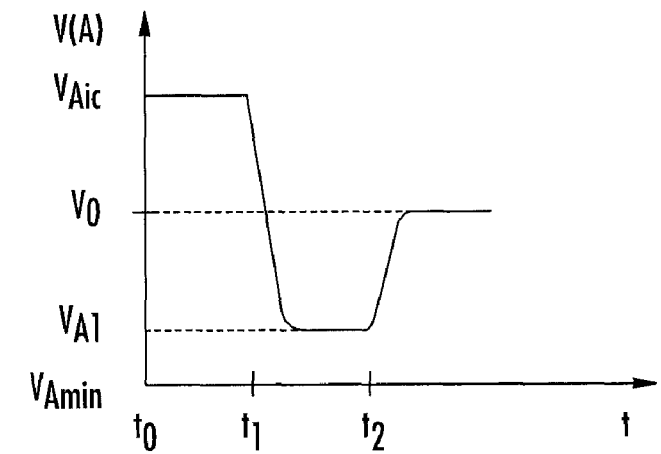
FIGS. 4A and 4B are timing diagrams for the circuit of FIG. 3.
Figure 4B:
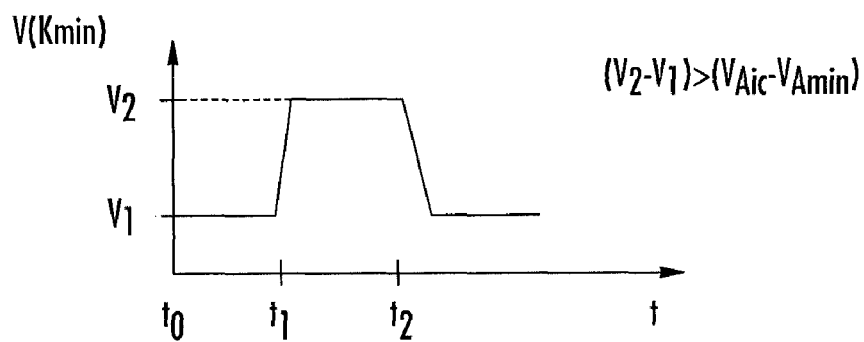

FIGS. 3, 4A and 4B illustrate a simplified charge storage and transfer circuit similar to that of FIG. 1. In FIG. 3 the second terminal of capacitor $C_A$ is connected to a clocked node Kminv rather than to a fixed voltage as in FIG. 1. Assume floating Node A is set to the same initial condition, $V_{Aic}$ at time $t_0$ as for the circuit of FIG. 1 to such as by operating precharge switch PRE. However, in the circuit of FIG. 3, at time $t_1$, the voltage of node Kminv is now clocked from voltage $V_1$ to voltage $V_2$ while charge $Q_i$ is injected onto Node A (e.g., by operating switch SW1). Equation 7 relates the transferred charge, $Q_i$, to the node voltage at A, $V_{A2}$, given the capacitance of node A, $C_A$, its initial potential $V_{Aic}$, and the voltage transition of Kminv.

$$V_{A2}=V_{Aic}Q_i/C_A(V_2-V_1)=V_{A1}+(V_2-V_1) \quad \text{Equation 7}$$

where $V_{A1}$ is given Equation 1.

The voltage $V_{A2}$ will always be more positive than $V_{A1}$ as long as the relationship V2>V1 is maintained. Equation 8 describes the charge capacity of this device.

$$Q_{Amax2}=(V_{Aic}-V_{Amin}+(V_2-V_1))C_A=Q_{Amax1}+(V_2-V_1)C_A \quad \text{Equation 8}$$

This the use of a switched voltage on the second terminal of the capacitor CA increases the charge capacity of the circuit by the quantity $(V_2-V_1)C_A$.

At time $t_2$, while the switch SW2 is closed connecting to Node A to voltage $V_O$ and initiating charge transfer off of node A, node Kminv is also returned from $V_2$ to $V_1$. Since node Kminv is returned to its initial condition, $V_1$, at time $t_2$, it has no net effect on the quantity of charge transferred into the Voltage source. The charge transferred through the voltage source VS is described by Equation 9.

$$Q_{o2}=Q_i-(V_{Aic}-V_o)C_A=Q_{o1} \quad \text{Equation 9}$$

Figure 2:
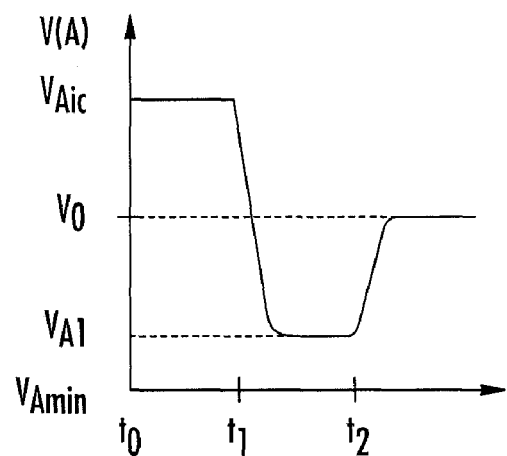
FIG. 2 is a timing diagram for the circuit of FIG. 1.

Since $Q_{o2}=Q_{o1}$, the charge transfer function of this device is identical to that of the device described in FIGS. 1 and 2, however its charge capacity has been increased. In practice, $V_2$ can be set to the maximum voltage available, while $V_i$ can be set to the minimum available. Note that the scale of FIGS. 4A and 4B are not the same; in most cases, the difference $(V_2-V_1)$ will be greater than $(V_{Aic}-V_{Amin})$. Thus the charge capacity of the transfer and storage node can be more than doubled without incurring the penalties described earlier.

Figure 5:
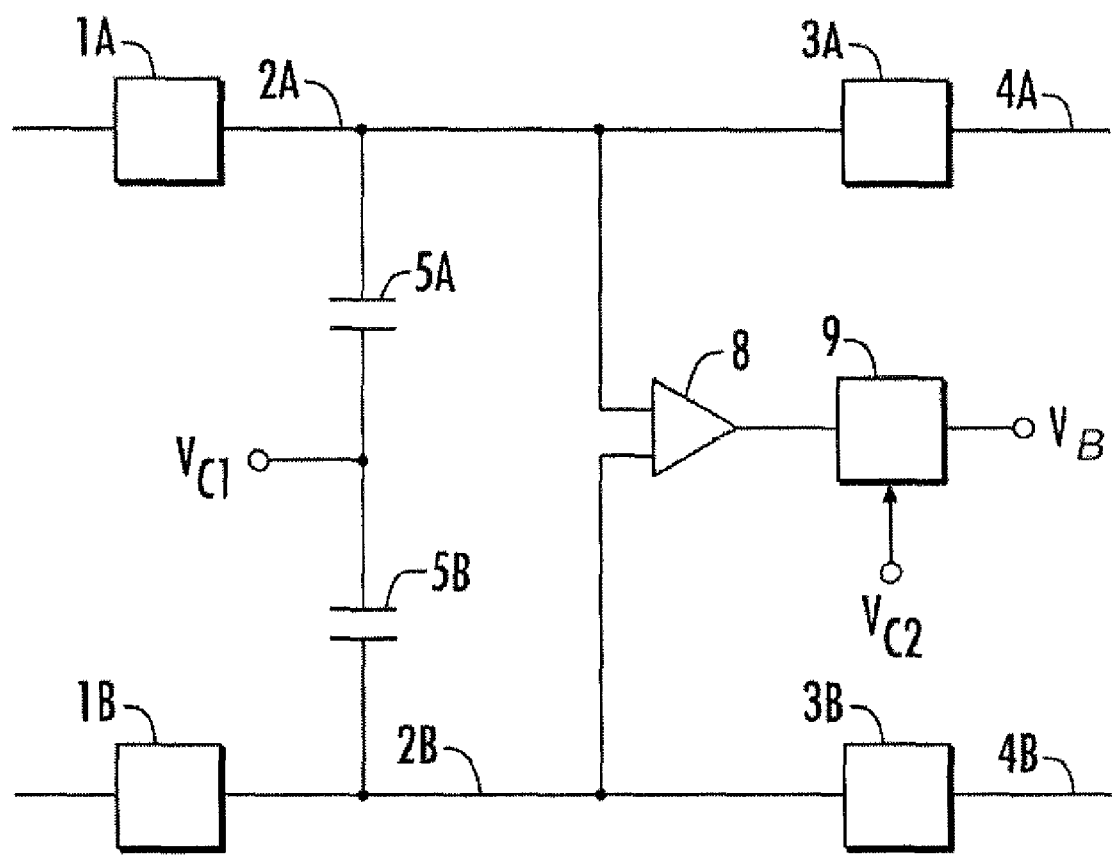
FIG. 5 is a high level diagram of a charge pipeline Analog to Digital Converter (ADC) that uses the circuit of FIG. 3.

FIG. 5 illustrates a charge domain pipeline stage that may use the principles of FIG. 3. The circuit contains two charge pipelines. The upper pipeline contains a charge transfer circuit 1A, storage node 2A, charge transfer circuit 3A, and capacitor 5A. In operation of the upper pipeline, charge is stored on the combination of capacitor 5A, which is connected between storage node 2A and clock voltage $V_{C1}$, and capacitor $C_A$ which is connected between storage node 2A and clock voltage $K_{minVA}$. Charge enters the stage via charge-transfer circuit 1A, and later exits the stage via charge-transfer circuit 3A. Voltage $V_{C1}$ is a digital clock signal which controls the timing of charge processing in the stage. Note the use of capacitor $C_A$ and corresponding signal KminvA to provide increased charge storage capability. The lower pipeline contains elements 1B ... 5B and $C_B$ as well as signal $K_{minVB}$ that are equivalent to elements 1A, 2A, 3A, 4A, 5A and $C_A$ of the upper pipeline.

Multiple circuits as shown in FIG. 5, with certain added elements can be arranged in a pipeline to provide the operations needed to carry out charge-domain Analog to Digital conversion: namely charge storage and transfer, charge comparison, and conditional and constant charge addition. These operations can be combined in various ways to carry out a variety of ADC algorithms, which may for example, carry out 1-bit, 1½ bit, 2 bits per stage or in other configurations as described in a co-pending U.S. Patent Publication No. 2008/0246646 entitled "Charge Domain Pipeline Analog to Digital Converter", U.S. Patent Publication filed Jan. 18, 2008, which is incorporated by reference herein.

Figure 6:
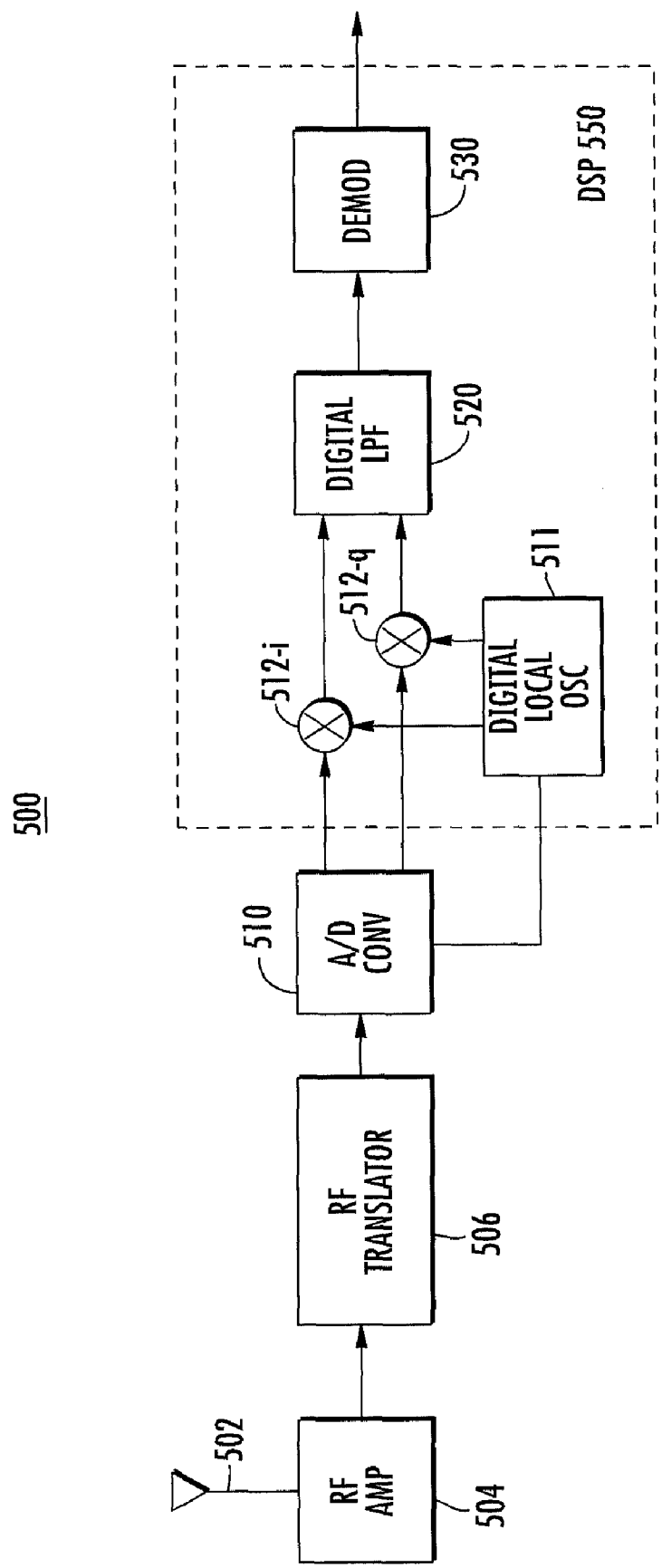
FIG. 6 is a high level diagram of a digital radio receiver that uses the ADC of FIG. 4.

One particular use of the ADC of FIG. 5 is to implement a digital radio receiver as generally shown in FIG. 6. A Radio Frequency (RF) signal is received at a radio frequency RF amplifier 504. The RF signal may have originated from an antenna 502, such as in a wireless end application, or may have been provided via a wire or optic fiber, such as may be in a cable modem or other wired communication signal interface. The amplified RF signal is then fed to an RF translator 506 to down-convert the amplified RF signal to an intermediate frequency (IF). After the RF translator 506 (which may be optional) the ADC 510 is then used to digitize the RF input into digital samples for subsequent processing. A digital local oscillator 511 may operate digital mixers 512-$i$ and 512-$q$ to provide in-phase and quadrature samples thereof. A digital low pass filter 520 limits the frequency content of resulting signal to the desired bandwidth. A demodulator 530 then recovers the original modulated signal. One or more of the operations of the digital local oscillator 511, mixers 512, low pass filter 520 and/or demodulator 530 may be implemented in a digital signal processor 550. The recovered signal may then be further processed, e.g., converted back to an analog baseband signal or the like, depending on the specific end application of the digital receiver.

While this invention has been particularly shown and described with references to example embodiments thereof, it will be understood by those skilled in the art that various changes in form and details may be made therein without departing from the scope of the invention encompassed by the appended claims.

What is claimed is:

1. A method for operating a charge transfer stage comprising:
    precharging a node to a precharge voltage, wherein the node is coupled to a charge storage device;
    transferring an input charge to the node via a charge transfer device, and as a result, causing a low voltage at the node to drop to a voltage in a range that includes a voltage that depends on a maximum possible input charge;
    changing an applied voltage which is applied to the charge storage device from a first voltage to a second voltage;
    at a later time, transferring charge from the node via the charge transfer device, and returning the applied voltage which is applied to the charge storage device to the first voltage; and
    controlling the precharge voltage, the maximum possible input charge, the first voltage and the second voltage; such that a difference between the precharge voltage and the low voltage is less than a range of the applied voltage.

2. The method of claim 1 wherein the later time occurs substantially simultaneously with the step of transferring charge from the node.

3. The method of claim 1 wherein the later time occurs before completing the step of transferring charge from the node.

4. The method of claim 1 wherein the charge storage device comprises one or more capacitors.

5. The method of claim 1 wherein the charge transfer stage is part of a charge domain pipeline.

6. The method of claim 5 wherein the charge domain pipeline is part of an analog to digital converter.

7. The method of claim 6 wherein the analog to digital converter is part of a digital radio frequency signal receiver.

8. A method comprising:
    (a) pre-charging a node to a precharge voltage, the charge transfer node coupled to a capacitor;
    (b) transferring an input charge to the node via a charge transfer device, and as a result, causing a low voltage at the node to drop to a voltage in a range that depends on a maximum possible input charge;
    (c) changing an applied voltage coupled to the capacitor from a first voltage to a second voltage;
    (d) transferring charge from the node;
    (e) at a time after step (d) is initiated, returning the applied voltage to the first voltage; and
    (f) controlling the precharge voltage, the maximum possible input charge, the first voltage and second voltage such that a difference between the precharge voltage and the low voltage is less than a range of the applied voltage in step (c).

9. An apparatus comprising:
    a node coupled to receive a precharge voltage at a first time, and to receive an injected input charge at a second time, such that a minimum voltage results on the node that is related to a maximum possible injected input charge;
    a charge storage device, coupled to the node and also coupled to an applied voltage;
    a signal generator, for changing the applied voltage from a first voltage to a second voltage at the second time when the injected input charge is received at the charge transfer node, and at a third time returning the applied voltage to the first voltage, and thereby transferring charge from the node and further for controlling the precharge voltage, the maximum possible injected input charge, the first voltage and the second voltage; such that a difference between the precharge voltage and the minimum voltage is less than a difference between the first and second voltages used as the applied voltage.

10. The apparatus of claim 9 wherein the third time occurs during transfer of charge from the node.

11. The apparatus of claim 9 wherein the third time occurs after initiating charge transfer from the node.

12. The apparatus of claim 9 wherein the charge storage device comprises one or more capacitors.

13. The apparatus of claim 9 wherein the node is part of a charge domain pipeline.

14. The apparatus of claim 13 wherein the charge domain pipeline is part of an analog to digital converter.

15. The apparatus of claim 14 wherein the analog to digital converter is part of a digital radio frequency signal receiver.

* * * * *